United States Patent
Chang

(10) Patent No.: US 8,076,930 B2
(45) Date of Patent: Dec. 13, 2011

(54) THIN FILM 3 AXIS FLUXGATE AND THE IMPLEMENTATION METHOD THEREOF

(75) Inventor: Hansung Chang, Seoul (KR)

(73) Assignee: Microgate, Inc., Anyang (KR)

( * ) Notice: Subject to any disclaimer, the term of this patent is extended or adjusted under 35 U.S.C. 154(b) by 335 days.

(21) Appl. No.: 12/297,284

(22) PCT Filed: Apr. 28, 2006

(86) PCT No.: PCT/KR2006/001602
§ 371 (c)(1),
(2), (4) Date: Mar. 17, 2009

(87) PCT Pub. No.: WO2007/126164
PCT Pub. Date: Nov. 8, 2007

(65) Prior Publication Data
US 2009/0278533 A1 Nov. 12, 2009

(51) Int. Cl.
*G01R 33/02* (2006.01)

(52) U.S. Cl. ........ 324/247; 324/253; 324/254; 324/255; 324/244; 324/260

(58) Field of Classification Search ................... 324/247, 324/249
See application file for complete search history.

(56) References Cited

U.S. PATENT DOCUMENTS

| | | | |
|---|---|---|---|
| 5,600,297 A | 2/1997 | Ruigrok et al. | |
| 7,187,167 B2 * | 3/2007 | Sato et al. | 324/244 |

FOREIGN PATENT DOCUMENTS

| | | |
|---|---|---|
| EP | 1329735 | 7/2003 |
| JP | 57083074 | 5/1982 |
| JP | 8-179023 A | 7/1996 |
| JP | 2002-232037 A | 8/2002 |
| JP | 2004-184098 A * | 11/2002 |
| JP | 2003-4831 A | 1/2003 |

(Continued)

OTHER PUBLICATIONS

Machine English Translation, Makoto. JP 2004184098 A, Nov. 2002.*

(Continued)

*Primary Examiner* — Huy Q Phan
*Assistant Examiner* — Alesa Allgood
(74) *Attorney, Agent, or Firm* — Rothwell, Figg, Ernst & Manbeck, P.C.

(57) ABSTRACT

There is provided a thin film tri-gate fluxgate for detecting a component of a magnetic field in directions of three axes, the thin film tri-gate fluxgate comprising: two first thin film fluxgates of a bar-type disposed on a plane for detecting horizontal components of the magnetic field in direction of dual axis; and a plurality of second thin film fluxgates for detecting a vertical component of the magnetic field, wherein each of the first thin film fluxgates and the plurality of the second thin film fluxgates comprises a drive coil for applying a power, a pickup coil for detecting a voltage and, a magnetic thin film, and wherein the plurality of the second thin film fluxgates are substantially perpendicular to each of the first thin film fluxgates wherein a length of the magnetic thin film of each of the plurality of the second thin film fluxgates is shorter than that of each of the two first thin film fluxgates, and wherein two end portions of each of the plurality of the second thin film fluxgates is wider than a center portion thereof.

15 Claims, 8 Drawing Sheets

FOREIGN PATENT DOCUMENTS

| | | |
|---|---|---|
| JP | 2003-218421 A | 7/2003 |
| JP | 2004-258038 A | 9/2004 |
| JP | 2004-271481 A | 9/2004 |
| JP | 2004-184098 * | 2/2007 |

OTHER PUBLICATIONS

Office Action issued in corresponding Japanese Appln. No. 2009-507568, dated Sep. 7, 2010, 5 pages.

* cited by examiner

[DRAWINGS]
[Figure 1] Prior Art
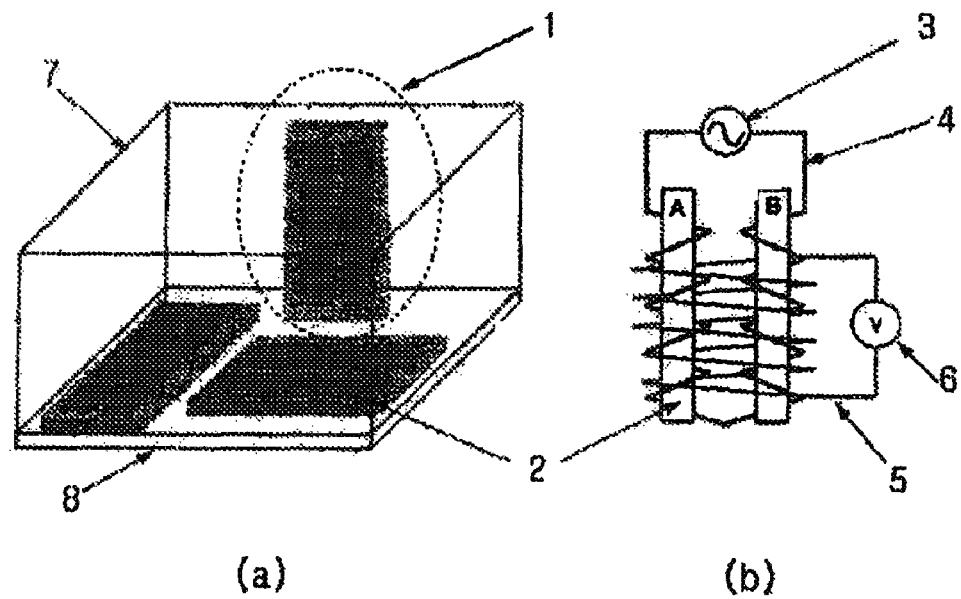
(a)  (b)
[Figure 2] Prior Art
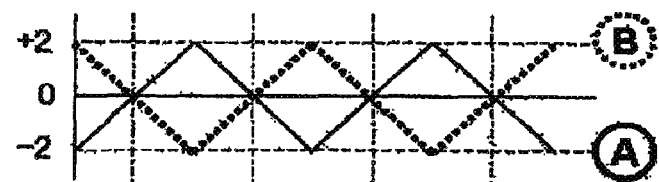
(a) Input (V)
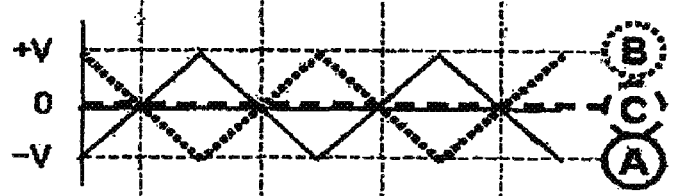
(b) Output (mV)
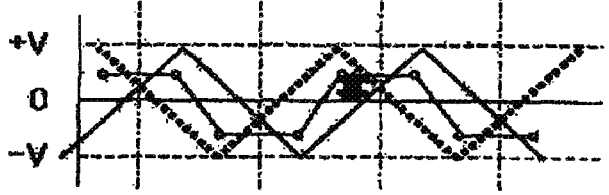
(c) Output (mV)

[Figure 3]
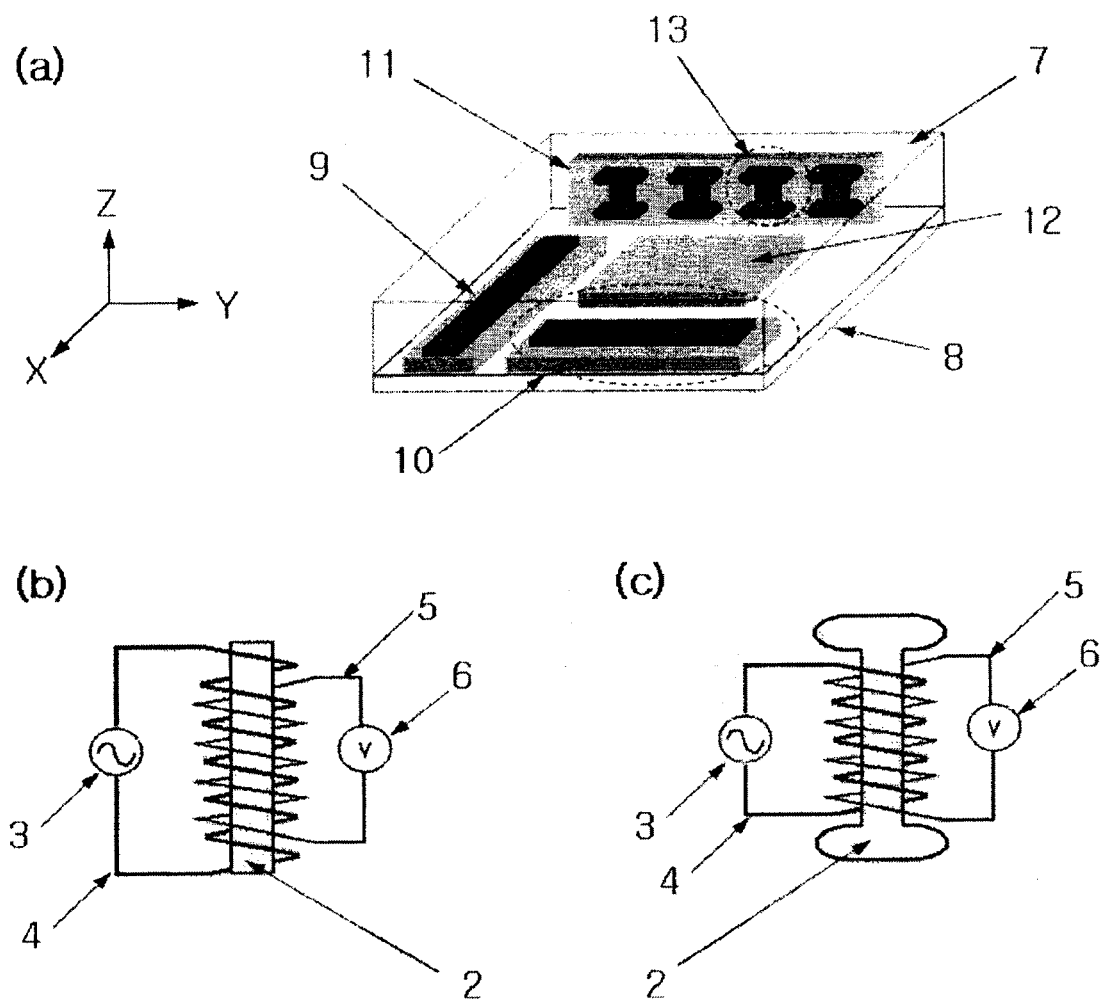

【Figure 4】
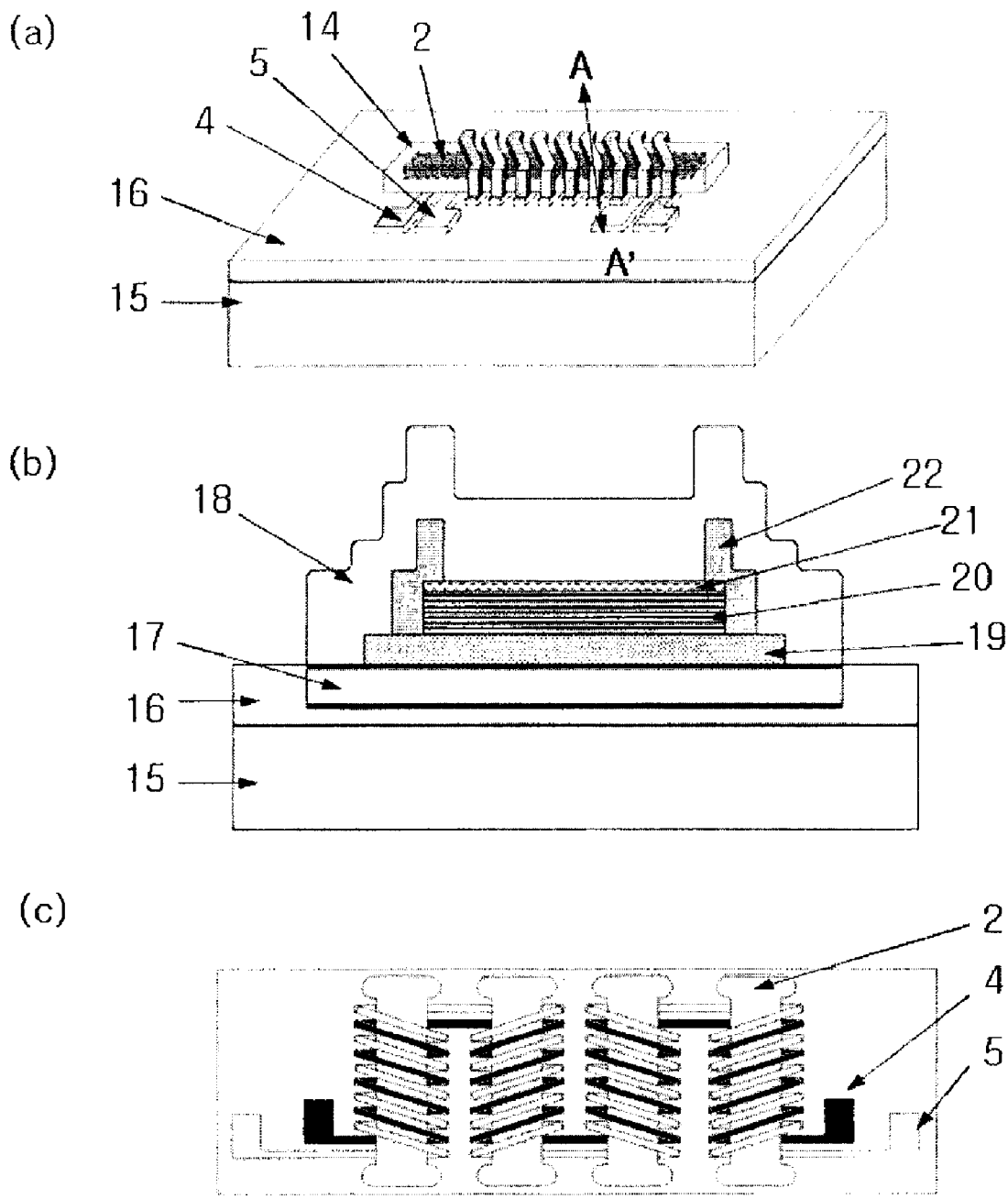

[Figure 5]
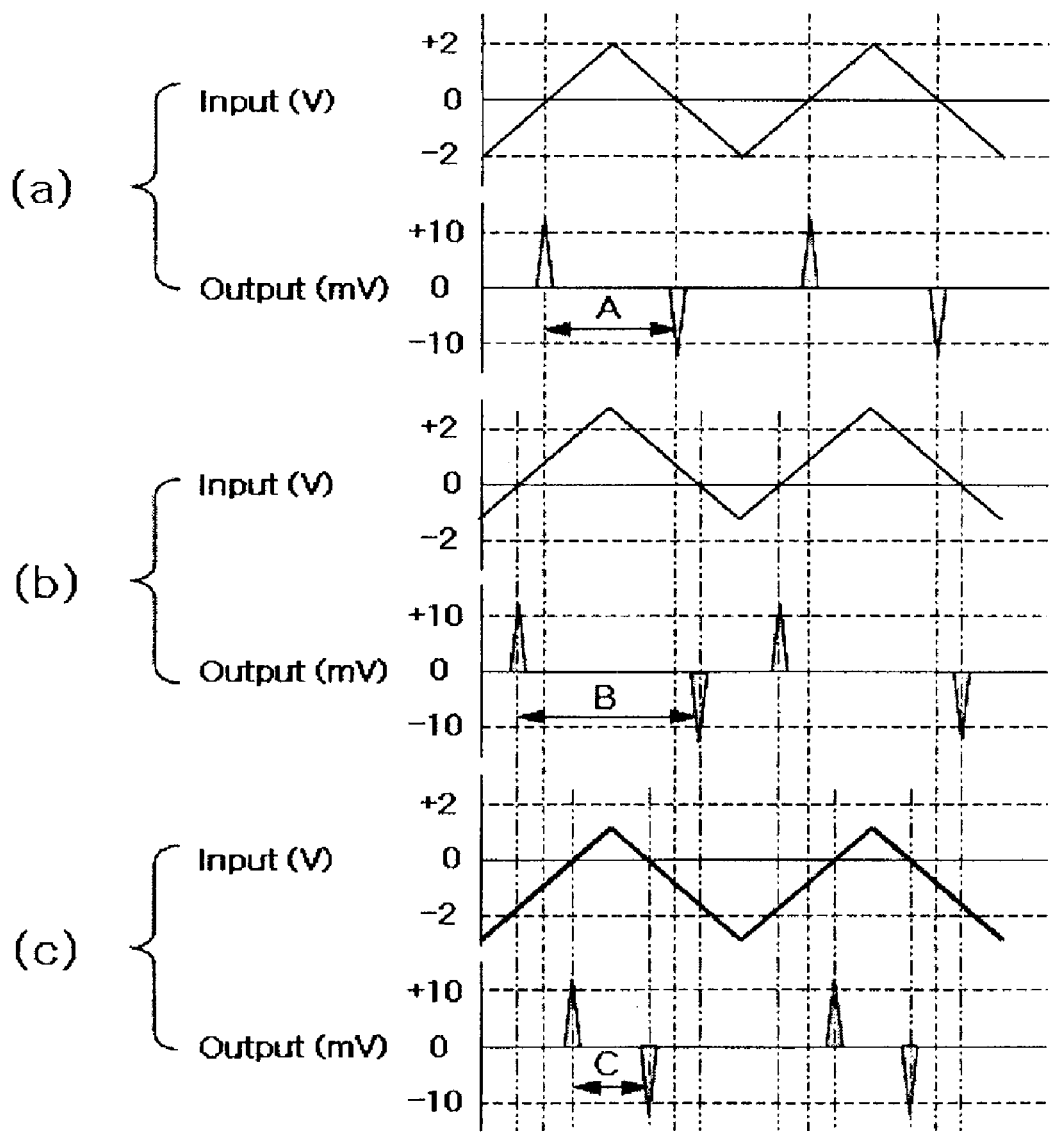

[Figure 6]
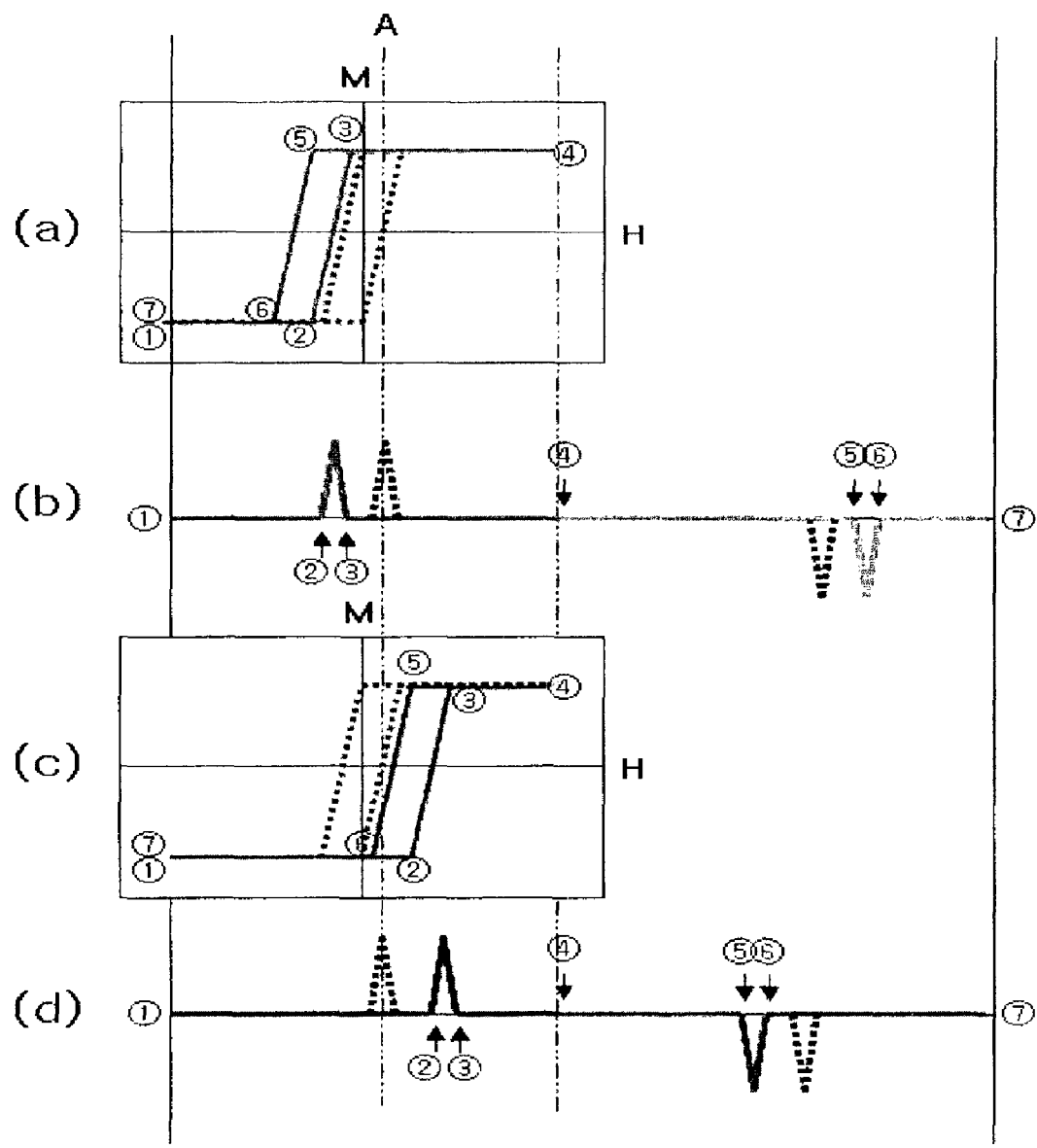

[Figure 7]
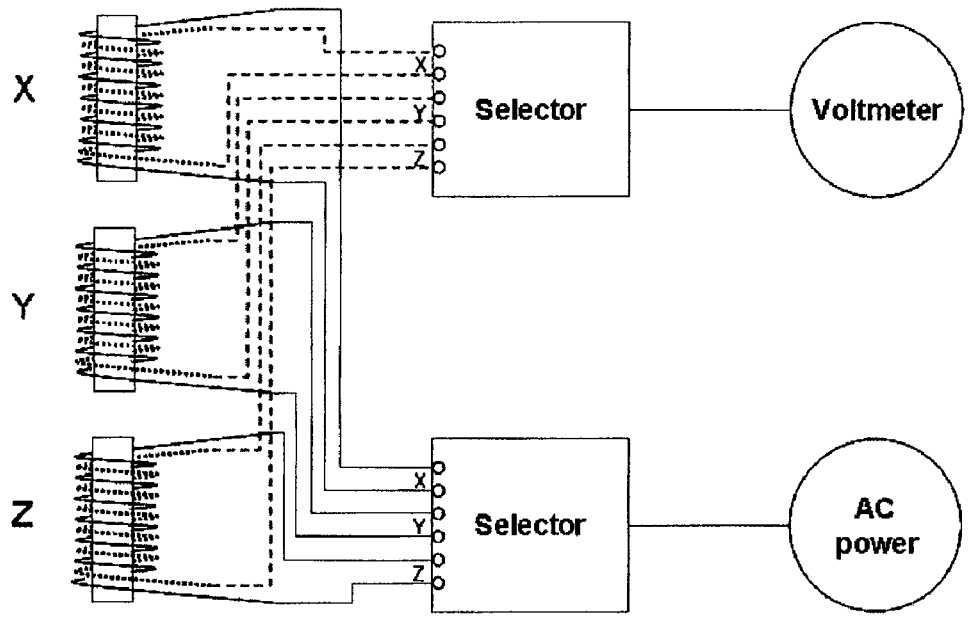
[Figure 8]
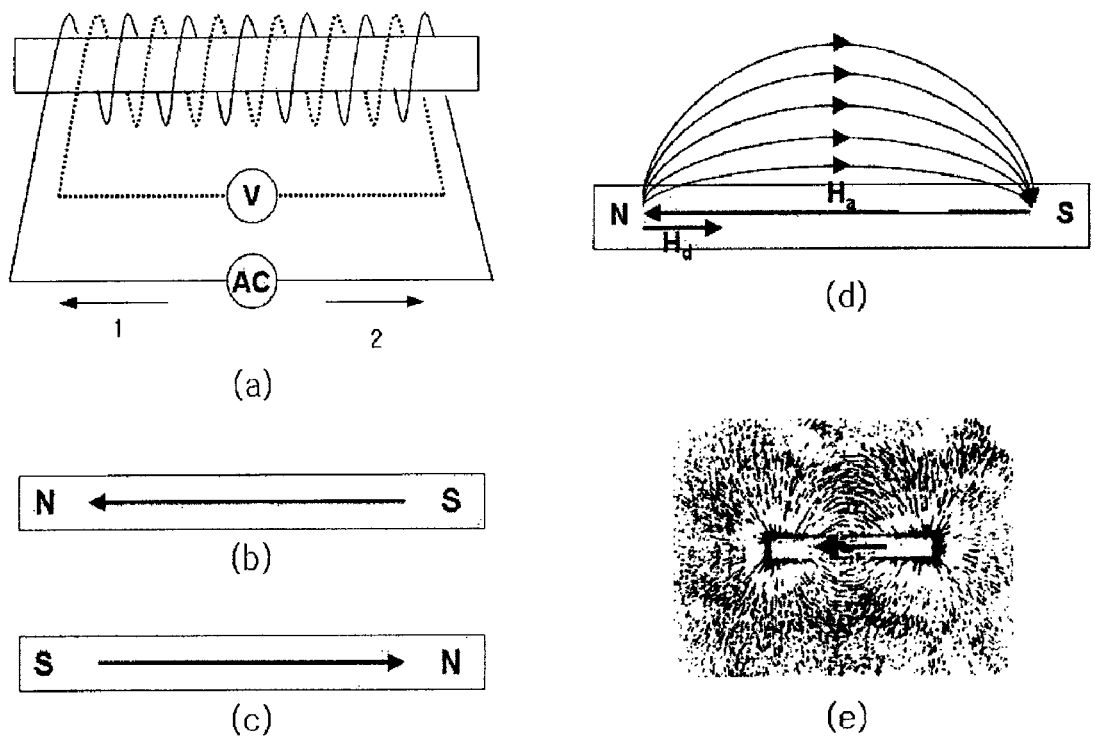

[Figure 9]
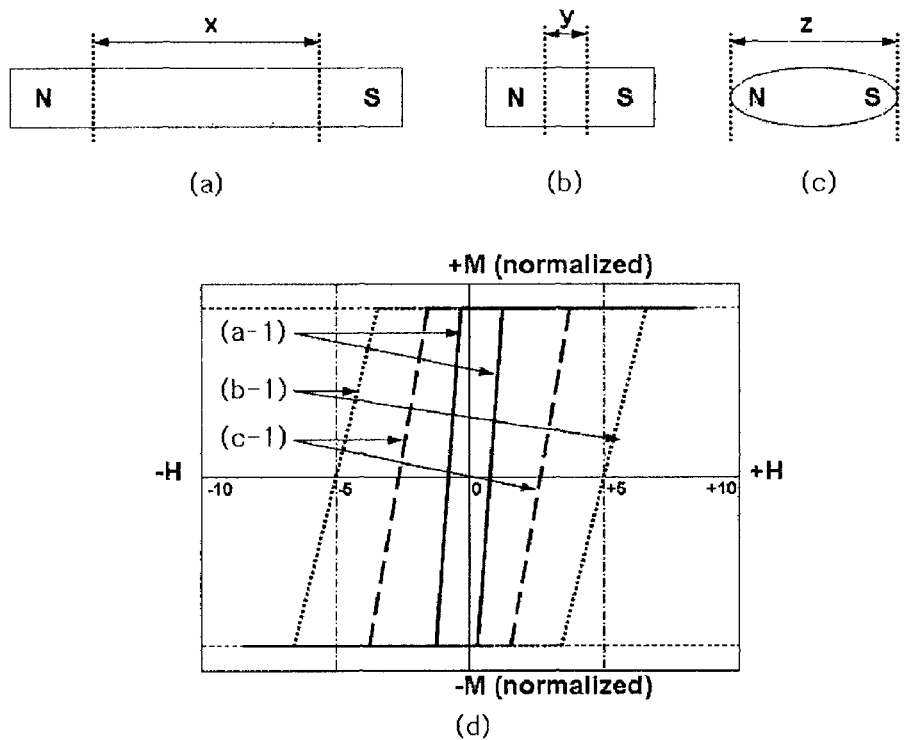
[Figure 10]
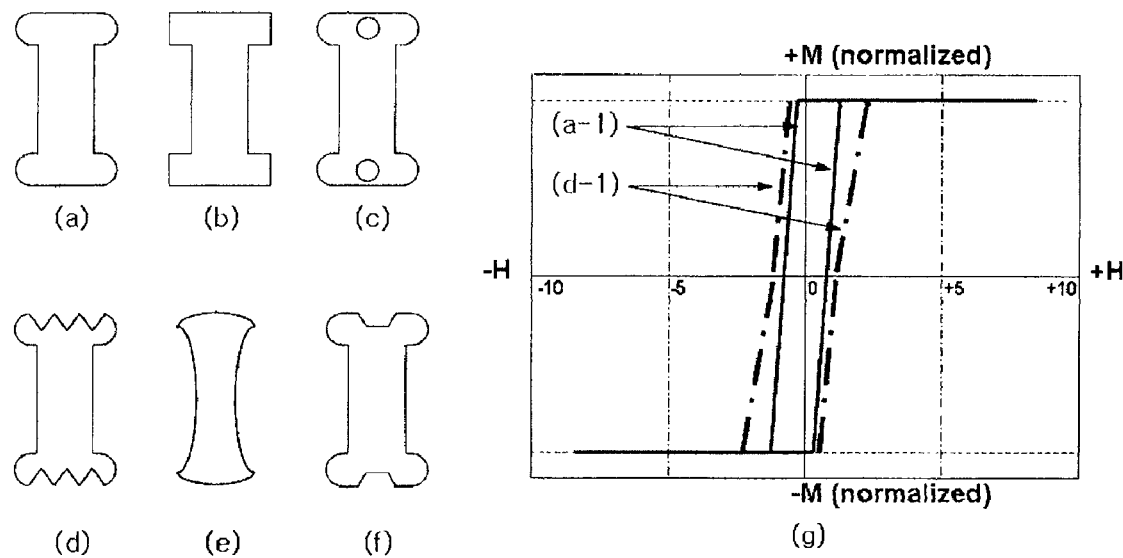

[Figure 11]
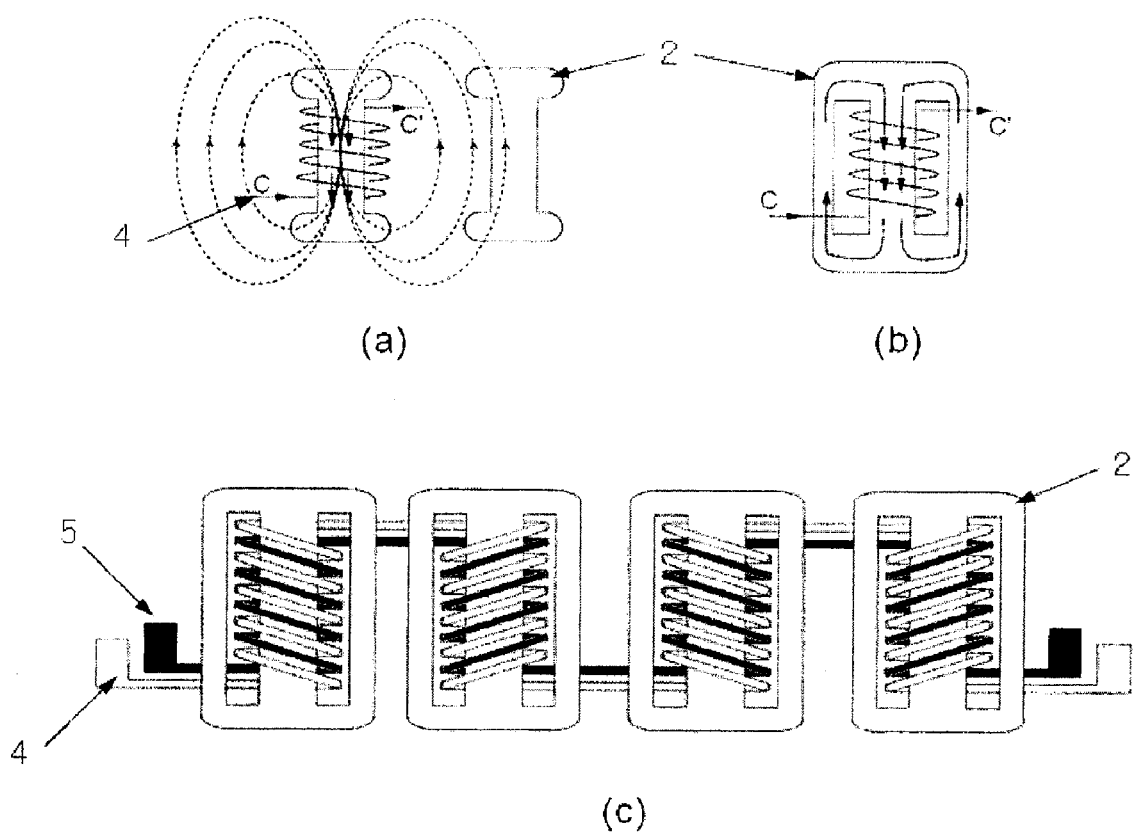

THIN FILM 3 AXIS FLUXGATE AND THE IMPLEMENTATION METHOD THEREOF

Cross Reference to Related Applications

This application is a 35 USC § 371 National Phase Entry Application from PCT/KR2006/001602, filed Apr. 28, 2006, and designating the United States.

TECHNICAL FIELD

The present invention relates to a thin film fluxgate for measuring an applied direction of an external magnetic field, and more particularly, to a thin film tri-gate fluxgate for measuring a horizontal dual axis component and a vertical component of a magnetic field.

BACKGROUND ART

A fluxgate 1 is a type of magnetic field sensor used for detecting a buried object containing iron such as a mine and for an electronic compass.

A basic structure of the fluxgate 1 comprises a ferromagnetic body 2, a drive coil 4 surrounding the ferromagnetic body 2, a separate pickup coil 5, an AC power supply 3 for applying an alternating current to the drive coil 4, and a voltmeter 6 for detecting a voltage induced in the pickup coil 5 as shown in FIGS. 1 and 3. The components may be located on a printed circuit board 8.

The operation principle of the fluxgate 1 is as follows. When the AC current is applied to the drive coil 4 winded on the ferromagnetic body 2, a time-varying induction magnetic field is generated around the coil 4, particularly in the coil 4, and the ferromagnetic body 2 is magnetized by the time-varying induction magnetic field to become an electromagnet having an N pole and an S pole. Since the induction magnetic field has a time-variance reversed according to a time, a magnetic pole of the ferromagnetic body 2 disposed in the coil 4 is also reversed according to the time, and a magnetic field formed by the ferromagnetic body 2 around the fluxgate 1 also varies according to the time. An induction current is generated by time-varying induction magnetic field, and a voltage wave or a voltage peak is detected in the pickup coil 5 as the time varies as shown in FIGS. 2 and 5.

FIG. 1 illustrates a conventional tri-axis fluxgate 7. The conventional fluxgate 7 has a structure wherein three fluxgates 1 are perpendicular to one another in order to measure a direction of an applied magnetic field such as a terrestrial magnetism. The fluxgate 7 shown in FIG. 1 operates in a following manner. A drive coil 4 and a pickup coil 5 are simultaneously winded on two bar-type magnetic bodies 2, i.e. a pair of bar-type magnetic bodies per axis of x, y and z axes. Thereafter, a pyramidal wave or a sinusoidal wave is inputted to the drive coil 4 to magnetize the two bar-type magnetic bodies 2 in different directions, and a voltage waveform detected at the pickup coil 5 simultaneously winded on the two bar-type magnetic bodies is read. (a) of FIG. 2 illustrates an input voltage waveform applied to magnetic bodies A and B of the two bar-type fluxgates having a structure shown in (b) of FIG. 1. A current inputted according to an identical drive coil is applied such that the magnetic bodies A and B are magnetized in the different directions.

(b) of FIG. 2 illustrates an output voltage waveform detected at the pickup coil winded on the two bar-type fluxgates. A solid line output waveform denoted as 'A' is a signal generated from the magnetic body A, and a dotted line output waveform denoted as 'B' is a signal generated from the magnetic body B. Pickup voltages of the two bar-type fluxgates have different polarity as shown in (b) of FIG. 2. The reason that the output voltage is similar to the input voltage as shown in (b) of FIG. 2 is that the conventional fluxgate uses a bulk-type magnetic body manufactured by binding a ferromagnetic bar or a ferromagnetic powder using an epoxy contrary to the present invention wherein a semiconductor technology is used. Therefore, a magnetic characteristic of the magnetic body is poor and the magnetic reversal of the magnetic body is imperfect, thereby electrically behaving as a simple transformer. The conventional product has a characteristic wherein the output wave is the pyramidal wave when the input wave is the pyramidal wave, and the output wave is the sinusoidal wave when the input wave is the sinusoidal wave.

A state shown in (b) of FIG. 2 illustrates an output signal when no external magnetic field is applied. As shown, when two signals are added, a state of 'O' volt is obtained by cancelling the voltage outputs having different polarities. A state shown in (c) of FIG. 2 illustrates an output signal detected in the conventional fluxgate when an external magnetic field is applied. A horizontal is relatively generated in the output voltage signal to generate a new output voltage from the state of 'O' volt/ the conventional fluxgate has the structure wherein two bar-type fluxgates are arranged per x, y and z axes, and each of the fluxgates generates the new output voltage as the magnetic field is applied.

DISCLOSURE

Technical Problem

The conventional fluxgate having the operation principle and the structure has a problem that an area occupied by the fluxgate is large since two bar-type magnetic body or a magnetic thin film should be formed per x, y, and z axes, and the fluxgate cannot be used in an electronic product such as a mobile phone requiring a flat electronic compass since the fluxgate having a large area should be disposed in the z-axis direction. Moreover, as shown in FIG. 2, since the outputted signal has a form of the transformer, an additional signal processing circuit for canceling the interactive signals is required, and a high capacity amplifier for removing a noise is required since an amplitude of a signal obtained by canceling the two pickup signals is small, thereby requiring a large current to be flown into the fluxgate for the operation of the fluxgate, i.e. for an amplification of the output signal in order to solve the problem. The characteristic of large current requirement prohibits a use of the fluxgate in a mobile device such as the mobile phone which requires a small power consumption.

Technical Solution

In order to solve the problem of the conventional art, it is an object of the present invention to provide a basic structure, operation method and a manufacturing method of a thin film tri-axis fluxgate which as a small size and a minimized power consumption for the operation of the device so that the tri-axis fluxgate may be used in a small electronic device such as a mobile phone.

In order to achieve the object of the present invention, there is provided a thin film tri-gate fluxgate for detecting a component of a magnetic field in directions of three axes, the thin film tri-gate fluxgate comprising: two first thin film fluxgates of a bar-type disposed on a plane for detecting horizontal components of the magnetic field in direction of dual axis; and a plurality of second thin film fluxgates for detecting a vertical component of the magnetic field, wherein each of the first thin film fluxgates and the plurality of the second thin film fluxgates comprises a drive coil for applying a power, a pickup coil for detecting a voltage and, a magnetic thin film, and wherein the plurality of the second thin film fluxgates are substantially perpendicular to each of the first thin film fluxgates wherein a length of the magnetic thin film of each of the plurality of the second thin film fluxgates is shorter than that of each of the two first thin film fluxgates, and wherein two end portions of each of the plurality of the second thin film fluxgates is wider than a center portion thereof.

The magnetic thin film comprises a stacked structure of a NiFe film of ferromagnetic material and an $Al_2O_3$ film of insulating material or a stacked structure of a NiFe film of ferromagnetic material and a $SiO_2$ film of insulating material wherein the NiFe film and the $Al_2O_3$ film or the NiFe film and the $SiO_2$ film are alternately stacked.

In addition, there is provided a method for manufacturing a thin film tri-gate fluxgate comprising at least two fluxgates for detecting horizontal components of a magnetic field in directions of a dual axis, and a second fluxgate for detecting a vertical component of the magnetic field in a direction of a single axis, the method comprising steps of: (a) arranging two or more first fluxgates of a bar-type comprising a conductive coil layer including a drive coil for applying a drive current and a pickup coil for detecting a signal, a magnetic thin film and an insulating thin film disposed between the conductive coil layer and the magnetic thin film on a plane, wherein the conductive coil layer is formed by sequentially depositing a lower coil thin film, a lower insulting thin film, the magnetic thin film, an upper insulating thin film, a side insulating thin film and an upper coil thin film on a silicon substrate; and (b) arranging a fluxgate comprising a conductive coil layer including a drive coil for applying a drive current and a pickup coil for detecting a signal, a magnetic thin film and an insulating thin film disposed between the conductive coil layer and the magnetic thin film such that the fluxgate is substantially perpendicular to the plane, wherein the conductive coil layer and the magnetic thin film are divided into a plurality of pieces and arranged in a widthwise direction, wherein each of the magnetic thin film comprises a stacked structure of NiFe films of a ferromagnetic material and Al2O3 films of an insulating material alternately stacked on one another.

It is preferable that the lower insulating film is formed on the lower coil thin film, and comprises a stacked structure of $SiO_2$ films and $Al_2O_3$ films alternately stacked on one another wherein a thickness of each of the $SiO_2$ films ranges from 2,000 Å (0.2 μm) to 20,000 Å (2 μm) and a thickness of each of the $Al_2O_3$ films ranges from 200 Å (0.02 μm) to 10,000 Å (1 μm).

In accordance with the present invention, the tri-axis fluxgate having a small size that may be installed in a small portable device such as the mobile phone or a PDA may be manufactured, and an electronic compass that may carry out an accurate detection of a direction on an earth surface by a power supply of less than 5V, or particularly less than 2V may be manufactured.

DESCRIPTION OF DRAWINGS

FIGS. 1a and 1b are diagrams illustrating a basic structure of a conventional dual bar-type fluxgate.

FIGS. 2a through 2c are diagrams illustrating an example of a voltage waveform detected from a pickup coil of the conventional fluxgate.

FIGS. 3a through 3c are diagrams illustrating a basic structure of a single bar-type fluxgate in accordance with the present invention.

FIGS. 4a through 4c are diagrams illustrating a detailed structure of a thin film fluxgate in accordance with the present invention.

FIGS. 5a through 5c are diagrams illustrating an example of a voltage waveform detected from a pickup coil of the thin film fluxgate in accordance with the present invention.

FIGS. 6a through 6d are diagrams illustrating an operation process of the thin film fluxgate in accordance with the present invention.

FIG. 7 is a diagram illustrating a power supply scheme and a pickup scheme of the thin film fluxgate in accordance with the present invention.

FIG. 8 is a diagram illustrating a magnetic behavior of a magnetic body in the thin film flux gate.

FIG. 9 is a diagram illustrating a magnetic characteristic of a magnetic thin film having a general form.

FIG. 10 is a diagram illustrating a magnetic characteristic of a magnetic thin film of the fluxgate in accordance with the present invention.

FIG. 11 is a diagram illustrating a shape of a magnetic thin film of the fluxgate in accordance with the present invention.

BEST MODE

The thin film tri-axis fluxgate 7 includes three bar-type thin film fluxgates 9, 10, 11 disposed in three directions to detect horizontal components and a vertical component of a magnetic field, thereby detecting a direction of the magnetic field and a direction on an earth surface based on the detection.

In accordance with the thin film tri-axis fluxgate 7, the fluxgate 9, 10, 11 for detecting the components of the magnetic field of each of the directions is manufactured in a form of a thin film. Particularly, the fluxgate 11 for detecting the vertical component of the magnetic field is manufactured using a plurality of magnetic thin films having a drive coil 4 and a pickup coil 5 winded thereon so that the fluxgate 11 is manufactured as a flat type that may be easily installed in the small electronic device such as the mobile phone. The fluxgate may include an integrated circuit 12 for driving the fluxgate.

The present invention will now be described in detail with reference to accompanied drawing. Configuration methods and operation methods of the conventional fluxgate and the fluxgate in accordance with the present invention will be described first, and a manufacturing method and structure of the fluxgate in accordance with the present invention will then be described. In addition, a magnetic characteristic of a product according to a design of the magnetic thin film of the z-axis fluxgate having a small size for detecting the vertical component of the magnetic field will be also described.

FIG. 3 illustrates an electronic compass employing a novel fluxgate in accordance with the present invention. Unlike a dual bar-type fluxgate per axis in prior art, the fluxgate in accordance with the present invention has a structure wherein a single bar-type fluxgate 9,10 per axis is disposed for an x-axis and a y-axis, and a plurality of small fluxgates 13 are disposed in a z-axis. The fluxgate 13 for z-axis manufactured for the electronic compass having a small thickness has a magnetic body having a shape of a dumbbell or an alphabet 'I'. (b) of FIG. 3 illustrates a shape of the fluxgate for measuring the horizontal components of the magnetic field, and (c) of FIG. 3 illustrates a shape of a unit device of the fluxgate for measuring the vertical components of the magnetic field. A length of the divided thin film for measuring the vertical components of the magnetic field is smaller than that of the fluxgate for measuring the horizontal components of the magnetic field so that the entire shape of the tri-gate fluxgate 7 has the small thickness.

FIG. 4 is a 3-dimensional diagram illustrating the fluxgate in accordance with the present invention. The fluxgate of the present invention is manufactured by subjecting a silicon substrate 15 coated with a thin film 16 to a thin film technology and an etching process. In order to manufacture the thin film fluxgate, a groove for forming a lower portion of a coil, i.e. a lower half of the coil is etched in the thin film disposed on the silicon substrate, and a lower coil 17 is then formed by filling the groove with a conductive material such as an aluminum. A magnetic body surrounded by an insulating film 14 is then formed on the lower coil, and an upper coil 18 is finally formed such that the lower coil 17 and the upper coil 18 simultaneously surround the thin film magnetic body to form the drive coil 4 and the pickup coil 5.

A detailed structure of the fluxgate in accordance with the present invention is shown in FIG. 4-(*b*). FIG. 4-(*b*) is a cross-sectional view taken along a line A-A' of FIG. 4-(*a*). In order to manufacture the thin film fluxgate, after removing a portion of the silicon substrate having the thin film 16 thereon where the lower coil 17 is to be formed by a photolithography process and the etching process, the aluminum which is an conductive layer is allocated therein. Thereafter, a lower insulating thin film 19 exposing both ends of the lower coil 17 and covering the entire fluxgate in a lengthwise direction is formed. The reason that the insulating thin film is not formed at the both ends of the lower coil 17 is to build a coil winding structure around the magnetic thin film wherein the end portions are connected during a formation process of the upper coil 18 which is a final process such that the magnetic thin film is surrounded by the insulating thin film 19. Thereafter, a ferromagnetic thin film 20 having a length and a width smaller than those of the lower insulating thin film 19 is formed, and an upper insulating thin film 21 for preventing an electrical short between the upper coil 18 and the ferromagnetic thin film 20 is then formed. Next, a side insulating thin film 22 for preventing an electrical short between a sidewall of the ferromagnetic thin film 20 and the upper coil thin film 18 is formed. Thereafter, the upper coil thin film 18 is formed, and a terminal at an end of the upper coil 18 is connected to a terminal of the lower coil 17 already formed to complete the manufacturing process of the thin film fluxgate.

In order to form the thin film fluxgate of the present invention, the lower coil 17, the lower insulating thin film 19, the ferromagnetic thin film 20, the upper insulating thin film 21, the side insulating thin film 22 and the upper coil 18 should be sequentially formed. Therefore, a use of a specific material is required as well as a formation of the ferromagnetic thin film 20 having a stacked structure when manufacturing each thin film in order to secure a mechanical characteristic for preventing a crack.

In order to remove a stress generated in the entire thin film fluxgate, $SiO_2$ having a higher shock-resistance toughness than insulating thin films such as $Ta_2O_5$, $Al_2O_3$ and $TiO_2$ is used as a material for the lower insulating thin film 19 so that a generation of stress in the thin film according to the formation of the thin film, is minimized and it is preferable that a thickness of the lower insulating thin film is 2,000 Å or higher in order to maintain a superior magnetic characteristic. More preferably, the thickness of the lower insulating thin film ranges from 2,000 Å (0.2 μm) to 20,000 Å (2 μm).

In accordance with another embodiment, the lower insulating thin film is formed as a dual layer thin film. The stress and the crack may be generated in the thin film fluxgate due to the fact that the thin film fluxgate is manufactured by stacking different materials having different thermal expansion coefficient. In accordance with the embodiment, the generation of the stress and the crack may be suppressed and a degradation of the magnetic characteristic of the magnetic thin film due to the stress and the crack may be prevented so as to improve an overall performance of the thin film fluxgate.

Specifically, it is preferable that the lower insulating thin film 19 has a dual layer structure wherein $SiO_2$ thin film is formed first and $Al_2O_3$ is sequentially formed. The first thin film forming the lower insulating thin film is preferably $SiO_2$ having the higher shock-resistance toughness and being softer than insulating thin films such as $Ta_2O_5$, $Al_2O_3$ and $TiO_2$ to reduce the stress generated in the thin film. It is preferable that a thickness of the $SiO_2$ thin film is 2,000 Å or higher. More preferably, the thickness of the $SiO_2$ thin film ranges from 2,000 Å (0.2 μm) to 20,000 Å (2 μm). The second thin film forming the lower insulating thin film is preferably the $Al_2O_3$ thin film which is harder than $SiO_2$. The reason the $Al_2O_3$ thin film is that the magnetic thin film formed on the lower insulating thin film 19 is superior on the $Al_2O_3$ thin film than the $SiO_2$. It is preferable that a thickness of the $Al_2O_3$ thin film is 200 Å or higher. More preferably, the thickness of the $Al_2O_3$ thin film ranges from 200 Å (0.02 μm) to 10,000 Å (1 μm).

The ferromagnetic thin film formed on the lower insulating thin film 19 has a low coercive force, a high magnetic permeability and a fast magnetic saturation which are required characteristic of the magnetic thin film. That is, in order to manufacture the ferromagnetic thin film to have a small width and a high squareness of a hysteresis loop, a NiFe thin film generally used as the magnetic thin film is alternately stacked with than the $SiO_2$ and the $Al_2O_3$ thin films. In accordance with one embodiment of the present invention, the stacked magnetic thin film used for manufacturing the thin film fluxgate is formed to have a structure of a $NiFe/Al_2O_3$ stacked film or a $NiFe/SiO_2$ stacked film. It is preferable that a thickness of the NiFe ferromagnetic film ranges from 300 Å to 900 Å and a thickness of the $Al_2O_3$ or the $SiO_2$ insulating thin film ranges from 50 Å to 250 Å. When the ferromagnetic thin film and the insulating thin film are formed to have the above thickness, the hysteresis loop has a form of a square and a small width. In order to make the output voltage generated by the thin film fluxgate large, that is, in order to increase an amount of the magnetic body, it is preferable that three or more pairs of the NiFe ferromagnetic film and the $Al_2O_3$ insulating thin film or the NiFe ferromagnetic and the $SiO_2$ insulating thin film are formed. The upper insulating thin film 21 of FIG. 4(*b*) is formed to prevent a short between the ferromagnetic thin film and the pickup coil wherein a distance between the stacked magnetic thin film having a magnetic reversal and the pickup coil surrounding the stacked magnetic thin film is reduced as a thickness of the upper insulating thin film is decreased. Therefore, a higher output peak is obtained as the thickness of the upper insulating thin film is decreased when the fluxgate is manufactured with other conditions maintained. Accordingly, it is preferable that a thickness of the upper insulating thin film ranges from 200 Å to 20,000 Å (2 μm) for reading the output through the pickup coil, and the output signal having a high voltage sufficient to be analyzed in a driving circuit is easily detected. When the thickness of the upper insulating thin film is too thin, the electrical short occurs between the magnetic thin film and the pickup coil, resulting in a difficulty in reading the pickup signal.

When the thickness of the upper insulating thin film larger than 20,000 Å (2 μm), the distance between the magnetic thin film and the pickup coil is increased, resulting in a reduction of the peak voltage measured in the pickup coil and a degradation of performance of the fluxgate.

(C) of FIG. 4 illustrates the z-axis fluxgate in accordance with the present invention. The z-axis fluxgate should have a small length to be installed in the mobile device such as the mobile phone. Therefore, in accordance with the present invention, a plurality of fluxgates short in length are disposed, and the drive coil and the pickup coil of each of the fluxgates constructed by using a single coil or by connecting separate coils so that the drive coil and the pickup coil of the fluxgates operates as an interconnected single coil. When a current is applied to the drive coil in accordance with the present invention, a magnetic reversal in an identical direction simultaneously occurs in the plurality of the magnetic thin film, and the pickup voltages generated in each of the plurality of the thin film fluxgate are added to appear in the pickup coil. Therefore, an amplitude of an isolated peak sufficient for a determination of the direction required for detecting an externally applied magnetic field is obtained.

In order to describe the operation scheme of the tri-axis thin film fluxgate in accordance with the present invention in detail, an operation scheme of a single bar-type fluxgate will be described with reference to FIGS. 5 and 6, and a reason for a requirement of a special design for a vertical magnetic field measurement and a measured result will then be described.

(a) of FIG. 5 illustrates input and output signals when the external magnetic field is not applied. The electrical signal of (a) of FIG. 5 illustrates a case wherein a lengthwise direction of the fluxgate is arranged in east-west direction when the fluxgate is used as an electronic compass. When the lengthwise direction of the fluxgate is arranged in east-west direction, the distance between the (+) and (−) peak voltages is denoted as 'A'(unit: time, in microseconds). When the external magnetic field is applied to a surrounding of the fluxgate (for instance, when the fluxgate is rotated to be under an influence of terrestrial the magnetic field formed in a north-south direction), a new induction electric field is generated around the fluxgate by a vector sum of the time-varying magnetic field generated form the magnetic body and the external magnetic field. Accordingly, the distance between the peaks in case of (b) of FIG. 5 (when the fluxgate heads south) is increased to 'B', and the distance between the peaks in case of (c) of FIG. 5 (when the fluxgate heads north) is decreased to 'C'. When the external magnetic field is applied, a peak shift phenomenon wherein the voltage peat is shifted to left or right occurs. Therefore, existence of the external magnetic field and a direction thereof may accurately determined by analyzing a degree of the peak shift of the voltage detected at the pickup coil when the external magnetic field other than the terrestrial magnetic field is not applied as shown in FIG. 5. The reason the isolated output appears in the output signal of the fluxgate in accordance with the present invention is that the distance between the coil surrounding the magnetic body and the magnetic body is reduced compared to a bulk assembled product by using a semiconductor thin film technology for manufacturing the fluxgate, and accordingly, a magnetization and the magnetic reversal of the magnetic thin film having a small thickness is easily achieved by a small current applied to the drive coil and the generation of a small voltage is accurately read by the pickup coil compared to the bulk assembled product.

FIG. 6 is a diagram illustrating the principle that the isolated or an independent peak of the output voltage shown in FIG. 5. The appearance of the independent peak through the pickup coil for detecting the output signal is closely related to the magnetic characteristic of the magnetic thin film constituting the thin film fluxgate. When a magnetic behavior of the magnetic thin film manufactured to be used with the fluxgate has a form of the hysteresis loop shown in FIG. 5, the pyramidal wave or the sinusoidal wave inputted to the drive coil of the fluxgate alternately applies the magnetic field to the magnetic body surrounded by the drive coil in a lengthwise direction of the magnetic thin film for the bar-type fluxgate according to an input period. That is, the magnetic field is alternately applied to the magnetic body in a right direction and in a left direction.

The inputted alternating current renders the magnetic body to have a certain magnetic behavior such as the magnetic behavior shown as (1) through (7) of (a) of FIG. 6. That is, the magnetic body shows a hysterisis characteristic by the inputted alternating current. A dotted line of (a) of FIG. 6 denotes a magnetic behavior when the external magnetic field such as the terrestrial magnetic field is not applied, and a dotted line of (b) of FIG. 6 denotes a position where the voltage peak appears when the external magnetic field such as the terrestrial magnetic field is not applied. The reason the independent peak appears is that the output voltage is proportional to a magnetization value varying according to time, i.e. to $d(M)/dt$. A solid line of (a) of FIG. 6 denotes a magnetic behavior when the magnetic field is applied from the right to the bar-type fluxgate disposed horizontally. When the magnetic field of a DC component such as the terrestrial magnetic field is applied form the right, the hysteresis loop is shifted to the left. Therefore, when the external magnetic field is applied from the right, the peak of the (+) output voltage is generated in a shorter time than when the magnetic field is not applied, and since the (−) output voltage generated at a position where the magnetization value is lowered after the hysteresis loop is generated at a later time, the distance between the output peaks is larger than the distance between the output peaks when the magnetic field is not applied. (c) and (d) of FIG. 6 illustrates the output peak when the external magnetic field is applied from the left of the bar-type fluxgate disposed horizontally. Contrary to above, the distance between is decrease.

The reason a single magnetic bar may be used to manufacture the tri-axis fluxgate in accordance with the present invention contrary to the conventional fluxgate is that the magnetization reversal is possible within a small variation of the magnetic field (H) by employing the ferromagnetic thin film having the hysteresis loop having the small width and the squareness using the magnetic thin film technology. When a gradient of the hysteresis loop is reduced, that is, when the magnetization reversal occurs in a wide range, the output signal waveform does not appear as the independent peak but appears as a signal having a small peak and a large width. The ferromagnetic body employed in the conventional fluxgate does not have the hysteresis loop having the squareness shown in FIG. 6, and has a long and flat form according to the applied magnetic field. Therefore, since a long time is required to change form −M to +M during the magnetization reversal, the isolated voltage peak does not appear and acts as a type of a transformer such that a different form of the pyramidal wave or the sinusoidal wave as shown in (a) of FIG. 2 is detected.

Since the present invention provides the output signal shown in FIGS. 5 and 6, that is, since the fluxgate in accordance with the present invention has a structure wherein the independent voltage peak is generated, the direction of the externally applied magnetic field may be measured by detecting the output voltage peak generated by each of the tri-axis fluxgate and calculating an amplitude of the external magnetic field applied in the lengthwise direction of each of the fluxgates.

The direction measurement is carried out by reading the shift of the output peak of each of the fluxgates according to the terrestrial magnetic field (a total amount is about 0.5 Gauss although differs depending on a region). The fluxgate response to the magnetic field applied in the lengthwise direction of the bar. The magnetic field is a vector, and the fluxgate detects a component applied in the lengthwise direction of the bar. Therefore, for example, when the terrestrial magnetic field is applied in a lengthwise direction of the x-axis fluxgate, that is, in an x-axis direction, the x-axis device generates a peak shift of 0.5 Gauss, and the y-axis and the z-axis devices do not generates any peak shift since the magnetic field is not applied to lengthwise directions of the y-axis and the z-axis devices. That is, when the peak shift of 0.5 Gauss occurs in the x-axis device, and the peak shift does not occur in the y-axis and the z-axis devices, the direction of the terrestrial magnetic field is determined to be in the x-axis direction.

That is, amplitudes of applied magnetic field applied in the lengthwise direction of the x-axis, the y-axis and the z-axis fluxgates generated due to the terrestrial magnetic field applied in an arbitrary direction is read and the direction of the applied magnetic field is determined using a separately developed software.

On the other hand, the present invention is to manufacture the fluxgate in a form of a chip such that an input voltage required for an operation of the x-axis, the y-axis and the z-axis fluxgates is not simultaneously applied to the x-axis, the y-axis and the z-axis fluxgates but the input alternating current is sequentially applied to the x-axis, the y-axis and the z-axis fluxgates using a power supply selector as shown in FIG. 7. That is, when the current is applied to the x-axis fluxgate, the current is not applied to the y-axis and the z-axis fluxgates to prevent the x-axis magnetic field generated during the operation of the x-axis fluxgate from affecting the operation of the y-axis and the z-axis fluxgates. When the current is simultaneously applied to the x-axis, the y-axis and the z-axis fluxgates, the fluxgates which become electromagnets applied the magnetic field to one another so that the output peak shift is generated, resulting in a hindrance of the operation of the electronic compass.

On the other hand, while the pickup coil of each of the fluxgates may be connected to a separate voltmeter to read the output signal. Also, as shown in FIG. 7 the selector may be attached to an output terminal of the fluxgate to select the output in the same order as the sequential input to the three fluxgate and analyze the distance between the voltage peaks sequentially generated in the x-axis, the y-axis and the z-axis fluxgates so as to obtain the direction on the surface.

FIG. 8 illustrates a magnetization phenomenon generated in the ferromagnetic body for describing the reason the dumbbell shape the magnetic thin film is required for a measurement of the vertical component of the magnetic field.

When the alternating current is applied to the thin film fluxgate, the current flows alternately in directions denoted as '1' and '2' as shown in (A) of FIG. 8. When the current flows in the direction denoted as '1' of (a) of FIG. 8, a magnetization direction of the ferromagnetic body is formed as shown in (b) of FIG. 8. When the current flows in the direction denoted as ?'of (a) of FIG. 8, a magnetization direction of the ferromagnetic body is formed as shown in (c) of FIG. 8. When this phenomenon occurs in a short time, the independent voltage peak appears as described above, wherein a magnetization state generated in the ferromagnetic body is as shown in (d) of FIG. 8. When the current applied to the drive coil generates the magnetic field in the coil as shown in (d) of FIG. 8, the magnetization direction of the magnetic body disposed in the coil directs the left where the N pole is formed. When the left of the magnetic body is the N pole, a demagnetization field Hd is generated through the inside as well as the outside of the magnetic body since the magnetic body becomes a magnet. This hinders the entire formation of the magnet in a single direction because the magnetization direction of end portions of the magnetic body differs from a center portion of the magnetic body. Therefore, the magnetization in a reverse direction is generated at the moment the magnetic body is formed so that the magnetization of the end portion of the magnetic body is dispersed, resulting in the end portion of the fluxgate not being able to contribute to the formation of the voltage peak according to the magnetization reversal. (e) of FIG. 8 illustrates a shape of the magnetic field of a magnet bar magnetized in a single direction, i.e. a permanent magnet. As shown, a portion where the magnetization direction is constant is limited to the center portion due to the demagnetizing field generated in the magnetic body.

FIG. 9 illustrates a magnetization reversal capable portion according to a size and a shape of the magnetic body that may be used for the fluxgate, and the hysteresis loop of the magnetic body or the magnetic thin film appearing when the magnetic body of a corresponding design is used. As shown in (a) of FIG. 9, when an elongated magnetic body is used, a region wherein the magnetization reversal is rotated by 180° may be secured to facilitate the magnetization reversal. Therefore, the hysteresis loop having a small width and a squareness as shown in (a-1) of FIG. 9(d) is obtained. When the length of the magnetic body is reduced, that is, when the small magnetic body used for the fluxgate for measuring the vertical component of the magnetic field is used, the magnetization reversal capable portion is reduced and an effect of the demagnetization field is increased to widen the hysteresis loop and to decrease a gradient of the hysteresis loop. When the hysteresis loop is widened, a strong magnetic field of more than 5 gauss should be applied to the magnetic body constituting the fluxgate in order to observe the independent voltage peak. This means that a large voltage of more than 10 volts should be applied to the fluxgate to supply a large current. One of limitation of the small mobile device such as the mobile phone is that the device should be operable at a low operating voltage. For operation of the fluxgate at the low operating voltage, it is not possible to correspond only by a reduction in size of the fluxgate. (c) of FIG. 9 illustrates an elliptical shape magnetic thin film generally used for the magnetic thin film for reducing the demagnetization field. In this case, a portion of the magnetic body where the demagnetization field is generated may be physically removed such that the magnetization direction in the magnetic body is revered in one direction. However, the lack of the demagnetization field simultaneously means that the magnetic body is stable in energy when the magnetic body is magnetized in the one direction. Therefore, it is difficult to magnetize the magnetic body in the left and the right direction or in an opposite direction continuously using the alternating current of a high frequency. While the magnetization reversal of the elliptical body of (c) of FIG. 9 shows a hysteresis loop having a small width as shown in (c-1) of (d) of FIG. 9, the coercive force which is the center of the magnetization reversal is more than 2.5 Gauss. Therefore, the high voltage is required for an operation, resulting in not being able to be used in the electronic compass for the mobile phone.

FIG. 10 illustrates a shape of the magnetic body used for the fluxgate for measuring the vertical component of the magnetic field, i.e. the z-axis fluxgate. The shape or the design of the magnetic body in accordance with the present invention is a dumbbell shape; an alphabet 'I' shape, an 'I' shape having a hole at both ends thereof, and/or a 'III' shape having an extruding portion thereof connected to each other. In case of the magnetic body shorter than 1 millimeter, the coercive force which is the center of the magnetization reversal is smaller than 1.5 gauss compared to the conventional elliptical magnetic body having the coercive force of 2.5 Gauss. The reason the smaller coercive force is required is that when the external magnetic field is applied the independent voltage peak of the fluxgate is shifted to the left and to the right, and when a range of the shift is larger than a range that may be detected by the fluxgate, that is, when the range of the shift is over a detectable range, the voltage peak is over a boundary of the detectable range, thereby disappearing. For instance, when the input voltage to the fluxgate is 2 volts and the magnetic field that may be generated by the drive coil is 2 Gauss, the distance of the independent peak may be detected since the magnetic body having the coercive force of 1 Gauss moves from 0.5 Gauss to 1.5 Gauss if a magnetic force of ±0.5 Gauss which is the amount of terrestrial magnetic field is applied. However, when the magnetic body having the coercive force of 2 Gauss is used, the voltage peak generated from the magnetic body is shifted by a distance larger than 2 Gauss which is the magnetic field that may be generated by the thin film fluxgate, whereby the peak disappears and a measurement reference point required for measuring the direction also disappears. (f) in (a) of FIG. 10 illustrates a design for the magnetic body invented for a use with a fluxgate sensor having a short length of no more than 1 millimeter, wherein the hysterisis loop having the squareness having a reduced width of the coercive force is generated although the sensors have different designs, and provides the small coercive force suitable for the thin film fluxgate although the length of the magnetic thin film is short. The reason the overall coercive force is reduced when the magnetic body have the shape of the magnetic body of FIG. 10, that is, when a width of an end portion of the magnetic body is larger than that of a center portion thereof is that a pole of the magnet (the N pole or the S pole) formed at that moment is distributed in a wide range to disperse the demagnetization field generated in the lengthwise direction of the magnetic body, that is, to distribute the magnetic field to the wide range, thereby reducing the demagnetization field generated in the lengthwise direction of the magnetic body.

FIG. 11 illustrates a design for minimizing an effect of the magnetic field generated in each of the fluxgates on the thin film fluxgate disposed in parallel. When a current is applied to the drive coil winded on the dumbbell shape thin film fluxgate in a direction of C-C' of the drive coil as shown in FIG. 11(a), the magnetic field generated in the drive coil directs downward and the magnetization direction of the magnetic thin film disposed in the drive coil also directs downward. Simultaneously, the magnetic field shown as a dotted line in FIG. 11(a) is generated outside the fluxgate device to be applied in a direction opposite to that of the fluxgate to be magnetized, thereby affecting the magnetization and the magnetization reversal of the fluxgate.

In order to prevent this problem, in accordance with another embodiment of the present invention, the NiFe/$Al_2O_3$ stacked films or the NiFe/$SiO_2$ stacked films having the magnetic permeability more than 1000 times higher than that of an air is used such that the ferromagnetic thin film is configured as a closed circuit, i.e. configured to have a shape of a roman numeral 'III' to eliminate the generation of the external magnetic field due to the magnetization of the ferromagnetic thin film. The plurality of the fluxgates in accordance with the right above embodiment constituting the thin film fluxgate for measuring the vertical component of the magnetic field may operate independently free from an interactive interference. FIG. 11 (c) illustrates the shape of the fluxgate for measuring the vertical component of the magnetic field shown in FIG. 11(b).

The fluxgate in accordance with the present invention may be manufactured by the method described with reference to FIGS. 3 and 4. However, since the key feature of the tri-axis fluxgate is that the fluxgate for detecting the vertical component of the magnetic field employs the plurality of the short thin films, it is within the scope of the present invention even when the fluxgate are manufactured by methods other than those shown in FIGS. 3 and 4.

In accordance with the fluxgate for detecting the vertical component of the magnetic field, the drive coils disposed around the plurality of the short thin films are electrically connected as a single drive coil in order to magnetize the plurality of the short thin films arranged in the widthwise direction to have a induction magnetic field having an identical form such that the plurality of the short thin films is magnetized using the single drive coil as shown in FIG. 3.

While the present invention has been particularly shown and described with reference to the preferred embodiment thereof and drawings, it will be understood by those skilled in the art that various changes in form and details may be effected therein without departing from the spirit and scope of the invention as defined by the appended claims.

INDUSTRIAL APPLICABILITY

In accordance with the present invention, the tri-axis fluxgate having a small size that may be installed in a small portable device such as the mobile phone or a PDA may be manufactured, and an electronic compass that may carry out an accurate detection of a direction on an earth surface by a power supply of less than 5V, or particularly less than 2V may be manufactured.

The invention claimed is:

1. A thin film tri-gate fluxgate for detecting a component of a magnetic field in directions of three axes, the thin film tri-gate fluxgate comprising:
   two first thin film fluxgates of a bar-type disposed on a plane for detecting horizontal components of the magnetic field in direction of dual axis; and
   a plurality of second thin film fluxgates for detecting a vertical component of the magnetic field,
   wherein each of the first thin film fluxgates and the second thin film fluxgates comprises a drive coil for applying a power, a pickup coil for detecting a voltage and a magnetic thin film, and
   wherein the second thin film fluxgates are substantially perpendicular to each of the first thin film fluxgates wherein a length of the magnetic thin film of each of the second thin film fluxgates is shorter than that of each of the two first thin film fluxgates, and wherein two end portions of each of the second thin film fluxgates is wider than a center portion thereof.

2. The thin film tri-gate fluxgate in accordance with claim 1, wherein the magnetic thin film comprises a stacked structure of a NiFe film of ferromagnetic material and a $Al_2O_3$ film of insulating material or a stacked structure of a NiFe film of ferromagnetic material and a $SiO_2$ film of insulating material wherein the NiFe film and the $Al_2O_3$ film or the NiFe film and the $SiO_2$ film are alternately stacked.

3. The thin film tri-gate fluxgate in accordance with claim 1, wherein a shape of the magnetic thin film of the second thin film fluxgates comprises a dumbbell shape, an 'I' shape, an 'I' shape having a hole at both ends thereof, and a 'III' shape having an extruding portion thereof connected to each other.

4. The thin film tri-gate fluxgate in accordance with claim 1, wherein the drive coil winded on the magnetic thin film is connected to one another and the pickup coil winded on the magnetic thin film is connected to one another such that a single drive coil and a single pickup coil wind the magnetic thin films.

5. The thin film tri-gate fluxgate in accordance with claim 4, wherein the power is applied to the drive coil of each of the first thin film fluxgates and the second thin film fluxgates and a distance between independent voltage peaks of an output signal appearing from the pickup coil.

6. The thin film tri-gate fluxgate in accordance with claim 5, wherein a drive current is sequentially supplied to the first thin film fluxgates and the second thin film fluxgates by a single power supply, wherein a direction is obtained by calculating a distance between three types of pickup signals generated at the first and the second thin film fluxgates, the pickup signals being sequentially detected by a single voltmeter connected to the bar-type thin film fluxgates and the plurality of the thin film fluxgates.

7. A method for manufacturing a thin film tri-gate fluxgate comprising at least two fluxgates for detecting horizontal components of a magnetic field in directions of a dual axis, and a second fluxgate for detecting a vertical component of the magnetic field in a direction of a single axis, the method comprising steps of:

(a) arranging the at least two first fluxgates of a bar-type comprising a conductive coil layer including a drive coil for applying a drive current and a pickup coil for detecting a signal, a magnetic thin film and an insulating thin film disposed between the conductive coil layer and the magnetic thin film on a plane, wherein the conductive coil layer is formed by sequentially depositing a lower coil thin film, a lower insulting thin film, the magnetic thin film, an upper insulating thin film, a side insulating thin film and an upper coil thin film on a silicon substrate; and (b) arranging a second fluxgate comprising a conductive coil layer including a drive coil for applying a drive current and a pickup coil for detecting a signal, a magnetic thin film and an insulating thin film disposed between the conductive coil layer and the magnetic thin film such that the fluxgate is substantially perpendicular to the plane, wherein the conductive coil layer and the magnetic thin film are divided into a plurality of pieces and arranged in a widthwise direction, wherein each of the pieces of the magnetic thin film has a drive coil and a pickup coil winded thereon, each of the pieces of the magnetic thin film comprises a stacked structure of NiFe films of a ferromagnetic material and $Al_2O_3$ films of an insulating material or a stacked structure of NiFe films of a ferromagnetic material and $SiO_2$ films of an insulating material alternately stacked on one another, and a length of each of the pieces of magnetic thin film of the second fluxgate is shorter than that of each of the at least two first fluxgates.

8. The method in accordance with claim 7, wherein the step (b) comprises electrically connecting the drive coils disposed about the magnetic thin film so as to magnetize the magnetic thin film arranged in the widthwise direction to have an induction field having an identical form.

9. The method in accordance with claim 7, wherein the lower coil thin film is formed by forming a groove in the silicon substrate and filling the groove with a conductive material.

10. The method in accordance with claim 7, wherein the lower insulating film is formed on the lower coil thin film, and comprises a dual layer stacked structure of $SiO_2$ films and $Al_2O_3$ films alternately stacked on one another wherein a thickness of each of the $SiO_2$ films ranges from 2,000 Å (0.2 μm) to 20,000 Å (2 μm) and a thickness of each of the $Al_2O_3$ films ranges from 200 Å (0.02 μm) to 10,000 Å (1 μm).

11. The method in accordance with claim 7, wherein each of the magnetic thin film comprises a stacked structure of NiFe films of the ferromagnetic material and the $Al_2O_3$ films or $SiO_2$ films of the insulating material alternately stacked on one another wherein a thickness of each of the NiFe films ranges from 300 Å to 900 Å and a thickness of each of the $Al_2O_3$ films or the $SiO_2$ films ranges from 50 Å to 250 Å.

12. The method in accordance with claim 11, wherein the magnetic thin film comprises at least three NiFe/$Al_2O_3$ stacked films or NiFe/$SiO_2$ stacked films.

13. The method in accordance with claim 7, wherein the upper insulating thin film has a thickness ranging from 200 Å to 10,000 Å (1 μm).

14. The method in accordance with claim 7, wherein two end portions of the magnetic thin film in the step (b) is wider than a center portion thereof.

15. The method in accordance with claim 14, wherein a shape of the magnetic thin film in the step (b) comprises a dumbbell shape, an 'I' shape, an 'I' shape having a hole at both ends thereof, and a 'III' shape having an extruding portion thereof connected to each other.

* * * * *